United States Patent [19]
De Winter et al.

[11] Patent Number: 5,627,316
[45] Date of Patent: May 6, 1997

[54] CAPACITIVE INCLINATION AND ACCELERATION SENSOR

[75] Inventors: Rudi De Winter, Heusden-Zolder; Roger Diels, Erps-Kwerps, both of Belgium

[73] Assignee: Sigma-Delta N.V., Tessenderlo, Belgium

[21] Appl. No.: 410,183

[22] Filed: Mar. 24, 1995

[51] Int. Cl.$^6$ .............. G01P 15/125; H01H 35/02; G01C 9/06
[52] U.S. Cl. .................. 73/514.32; 200/61.52; 200/61.45 R; 340/669; 361/280; 33/366
[58] Field of Search ............. 73/514.32, 514.35, 73/514.39, 514.01; 33/366; 200/61.52, 61.45 R, 61.83; 340/689, 669, 670, 440; 361/280

[56] References Cited

U.S. PATENT DOCUMENTS

| | | | |
|---|---|---|---|
| 2,979,959 | 4/1961 | Clurman | 73/516 |
| 4,422,243 | 12/1983 | Brunson et al. | 33/366 |
| 4,493,155 | 1/1985 | Comeau et al. | 33/366 |
| 4,587,741 | 5/1986 | Rorden et al. | 33/366 |
| 4,624,140 | 11/1986 | Ekchian et al. | 73/304 |
| 4,676,103 | 6/1987 | Nakajima | 73/516 |
| 4,707,927 | 11/1987 | Hiyama | 33/366 |
| 4,747,216 | 5/1988 | Kelley et al. | 33/366 |
| 5,040,418 | 8/1991 | Kushida et al. | 73/517 |
| 5,079,847 | 1/1992 | Swartz et al. | 33/366 |
| 5,136,126 | 8/1992 | Blair | 200/61.52 |
| 5,148,604 | 9/1992 | Bantien | 33/366 |
| 5,151,763 | 9/1992 | Marek et al. | 357/26 |
| 5,153,566 | 10/1992 | Yun | 340/689 |
| 5,209,343 | 5/1993 | Romano et al. | 200/61.52 |
| 5,233,213 | 8/1993 | Marek | 257/415 |
| 5,237,135 | 8/1993 | Wolski | 200/61.45 R |
| 5,353,641 | 10/1994 | Tang | 73/157 |
| 5,383,364 | 1/1995 | Takahashi et al. | 73/517 |
| 5,410,113 | 4/1995 | Mielke | 200/61.45 R |
| 5,444,917 | 8/1995 | Nelson | 33/366 |
| 5,483,748 | 1/1996 | Groves et al. | 33/366 |

FOREIGN PATENT DOCUMENTS

| | | |
|---|---|---|
| 60-197449 | 10/1985 | Japan. |
| 2168149 | 6/1986 | United Kingdom. |

*Primary Examiner*—Hezron E. Williams
*Assistant Examiner*—Richard A. Moller
*Attorney, Agent, or Firm*—Townsend and Townsend and Crew LLP

[57] ABSTRACT

A capacitive position sensor employs conventional printed circuit board (PCB) technology to detect capacitive changes caused by the movement of a ball along conductive tracks. A recessed region (or through hole) is stamped on the PCB with well controlled dimensions. Electrically conductive tracks are laid around the region and connect to a capacitance detection circuit on the PCB. As the PCB experiences inclination or acceleration the ball moves along the axis of the recessed region causing variations in the measured capacitance.

14 Claims, 5 Drawing Sheets

CAPACITIVE INCLINATION AND ACCELERATION SENSOR

BACKGROUND OF THE INVENTION

The present invention relates in general to inclination and acceleration sensors, and in particular to a sensor operating based on capacitive detection of a position of a ball.

Conventional position sensors rely upon the detection of electrical (ohmic) contact between a movable element and a stationary sensor. Such systems typically employ either an electrically conductive ball or a liquid-like material such as mercury as the movable element. There are disadvantages associated with such systems. Reliance on a conductive (e.g., metal) ball for example makes the system susceptible to dust, oxidation, and erosion. Mercury-wetted systems on the other hand require special housing, are toxic and tend to be more expensive.

There have been inclination sensors developed that operate based on detecting capacitive variations. Such systems typically employ some type of liquid that is placed inside a domed or spherically-shaped housing. The walls of the spherically-shaped housing act as capacitive plates such that any movement of the liquid affects a change in the measured capacitive value. Examples of these types of sensors can be found in U.S. Pat. Nos. 4,422,243, 4,624,140, 4,707,927, and 5,079,847. Other types of inclination and acceleration sensors have been developed employing magnetic or inductive elements and semiconductor or silicon based components. Each one of these systems is developed for a particular application requiring a specific degree of precision and speed of detection. Most, however, are not suitable for a low cost, compact design that can be incorporated onto for example a small printed circuit board.

There is therefore a need for a reliable and cost-effective inclination and acceleration sensor.

SUMMARY OF THE INVENTION

The present invention provides an inclination and acceleration sensor that detects capacitive changes caused by movement of a ball along a track on a printed circuit board.

In one embodiment, the sensor of the present invention includes a printed circuit board having an elongated recessed region (or a though hole) with a ball rollably disposed thereon. A first terminal of electrically conductive track is disposed along a first side of the elongated recessed region, and a second and third terminals of electrically conductive tracks are disposed along a second side of the elongated recessed region. A capacitance detection circuit connects to the first, second and third terminals for detecting a change in the capacitance between the first and second terminals and the first and third terminals, as the ball rolls along the elongated recessed region.

In one embodiment, the elongated recessed region is shaped such that the ball rests in a central portion when the printed circuit board is undisturbed, and rolls in one of two directions along a single longitudinal axis of the elongated recessed region when the printed circuit board is disturbed. The shape of the recessed region can be accurately adjusted to define a threshold angle that controls the point at which the ball starts to roll. In another embodiment, the recessed region is shaped such that the sensor provides a continuous read out.

Because the position sensor of the present invention operates based on detection of capacitive variations caused by movement of the ball (i.e., requires no ohmic contact), it is far less susceptible to erosion. Neither does the sensor of the present invention require spherically-shaped plates for housing liquid, or other types of structures that can not be readily designed with conventional printed circuit board technology.

A better understanding of the nature and advantages of the various embodiments of the sensor of the present invention may be had with reference to the diagram and detailed description below.

DESCRIPTION OF THE PREFERRED EMBODIMENT

Figure 1:
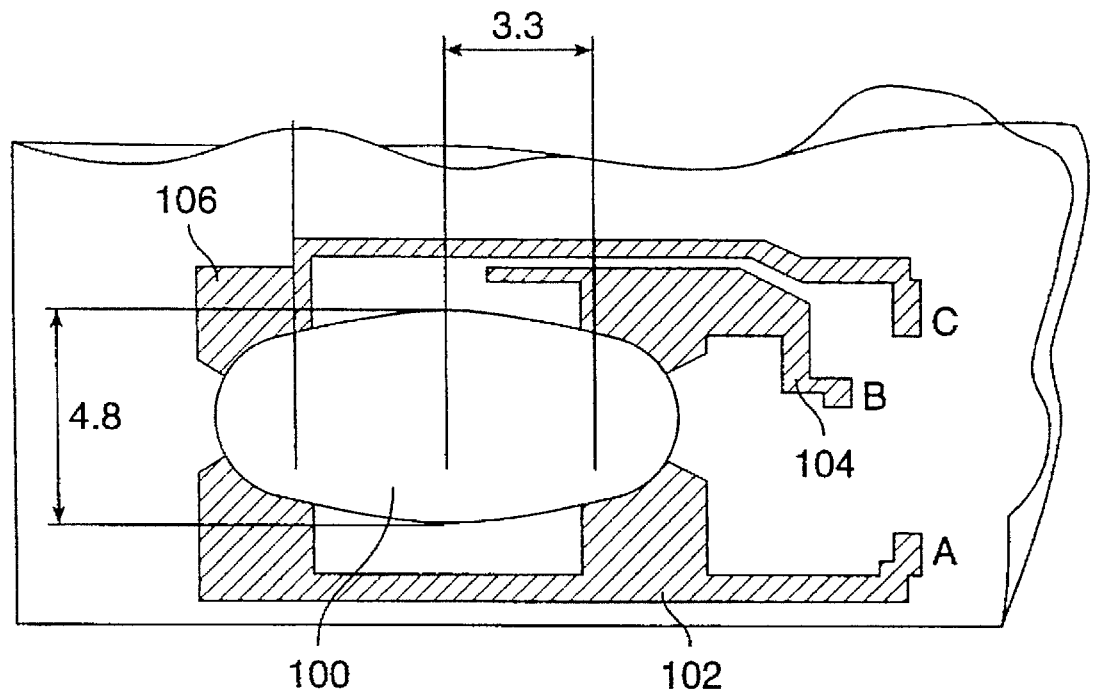
FIG. 1 is a top view of a portion of the printed circuit board showing one embodiment of a recessed region in the board as well as the capacitor terminals made of electrically conductive tracks.

Referring to FIG. 1, there is shown a top view of a portion of a printed circuit board according to one embodiment of the present invention. An elongated region 100 with accurately defined dimensions is cut through the board. The region 100 is preferably a through hole, but may also be in the form of a recessed into the board. A first electrically conductive layer 102 made of, for example, copper is laid on one side of the region 100 and brought to the edges of the two ends of the region 100 as shown. Second and third electrically conductive layers 104 and 106 are laid at the edges of the two ends of the region 100 on the opposite side. The copper tracks 102, 104, and 106 correspond to the terminals A, B, and C, respectively, of two variable capacitors $C_{ab}$ and $C_{ac}$. The capacitance between these terminals varies as a movable ball rolls from one end of the hole 100 to the other. The principles of operation will be described hereinafter.

Figure 2:
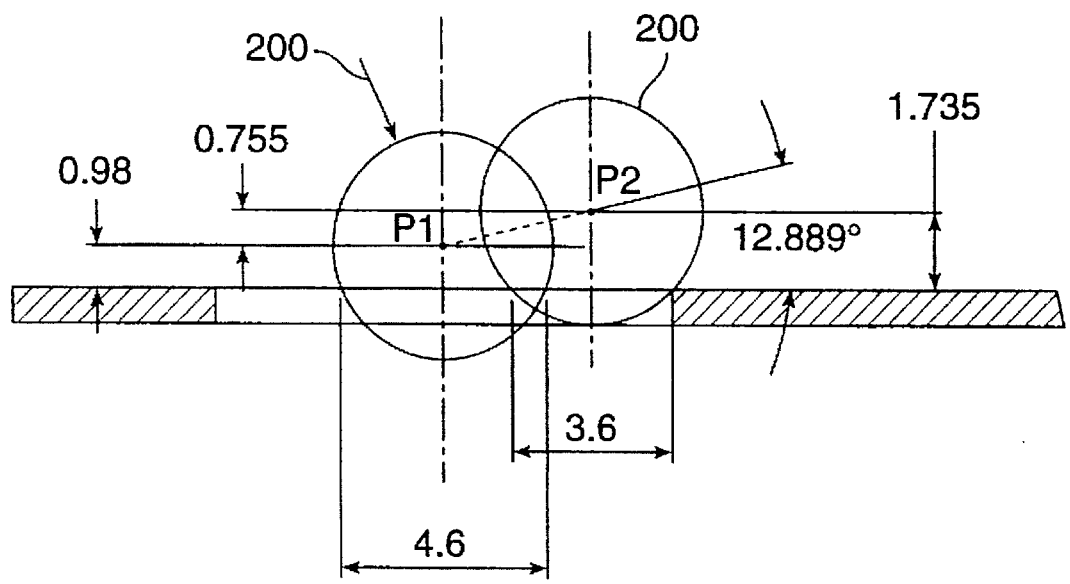
FIG. 2 shows the position of the ball as it rolls along the axis of the recessed region for calculating the angle of inclination.

As shown in FIG. 1, the hole 100 is shaped such that its maximum width is in a central portion, preferably at the midpoint. The width of the hole decreases as it approaches the ends. This particular shape of the hole 100 allows the movable ball to rest in the widest mid section when the board is level. The ball starts to move only after the board is inclined more than a predefined threshold angle. The value of this threshold angle is defined by the dimensions of the hole 100. FIG. 2 illustrates how this angle can be calculated. When the ball 200 rests in the widest mid section, its center of gravity is at its lowest point P1. As the ball 200 moves away from the center along the longitudinal axis of the hole 100, the narrowing of the hole 100 causes its center of gravity to move upward. If the center of gravity of the ball 200 is at point P2 when the ball reaches the end of the hole, the threshold angle of inclination would be given by the angular difference between points P1 and P2. Thus, by adjusting the length of the hole along its longitudinal axis and the width of the hole at its mid section, the threshold angle of inclination can be defined. The entire apparatus can be designed with very small dimensions. The hole 100 can be as small as, for example, about 11 mm in length and 4.6 mm at the point of maximum width. The ball can be, for example, 5 mm in diameter. With these exemplary dimensions as shown on FIG. 1, the threshold angle would be approximately 12.9 degrees. It is to be understood that these specific dimensions depicted in FIGS. 1 and 2 are only exemplary. All these dimensions can be for example divided in half to achieve the same threshold angle, or the sizes of the hole 100 and the ball 200 can be changed to obtain various threshold angles.

Figure 3A:
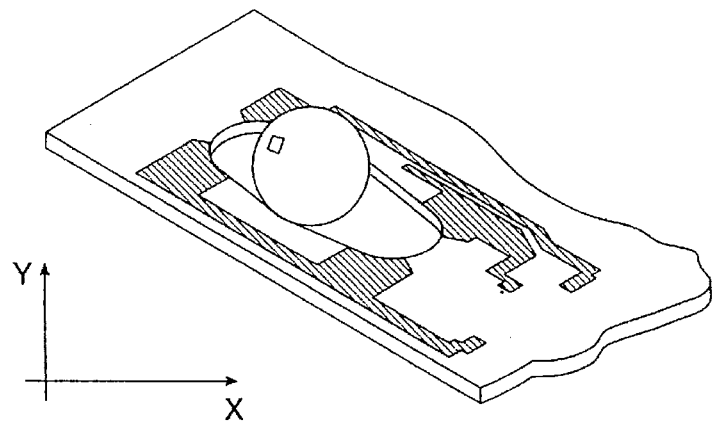
FIGS. 3A, 3B, and 3C show the printed circuit board and the ball in various positions.
Figure 3B:
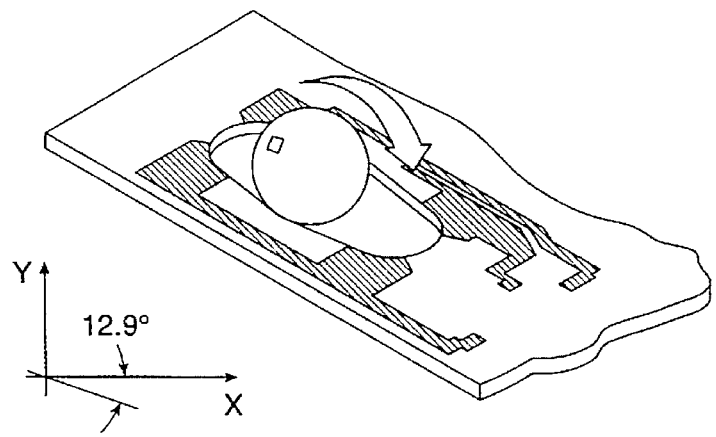
Figure 3C:
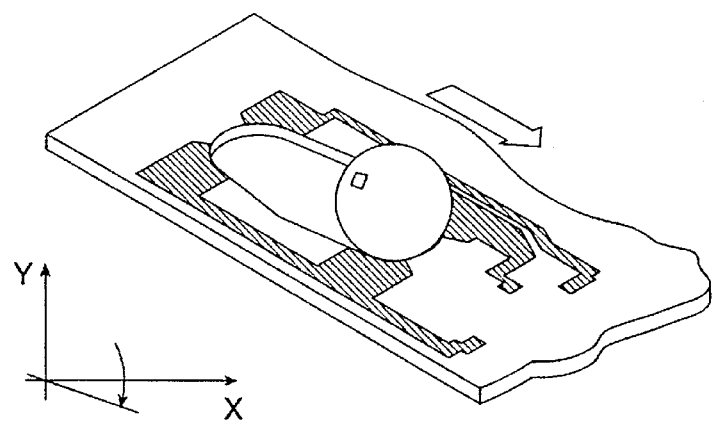

FIG. 3A shows the printed circuit board in a level position with the ball 200 resting in the middle section of the hole 100. FIG. 3B shows the printed circuit board inclined just under the threshold angle, which maintains the ball 200 in the mid section of the hole 100. FIG. 3C shows the board inclined passed the threshold angle which causes the ball 200 to move all the way to one end of the hole 100. Thus, in this particular embodiment, there are three stable positions for the ball 200.

Referring back to FIG. 1, copper tracks 102, 104, and 106 are laid around the hole 100 such that the movement of the ball 200 directly impacts the value of capacitance between the tracks. Copper track 102 acts as a common terminal A and lies adjacent to one side of the hole 100 and makes contact to both ends of the hole 100. On the opposite side of the hole 100, copper tracks 104 and 106 (terminals B and C) contact the right and the left ends of the hole 100, respectively. Thus, when the ball rolls to one end, say the left end in FIG. 1, the distance between the ball 200 and terminals A and C is minimized. This causes the capacitance between terminals A and C to increase.

Figure 4:
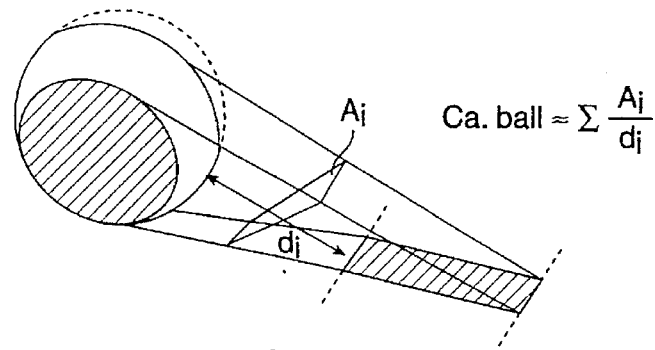
FIG. 4 illustrates the variation in the value of the capacitance caused by a moving ball.

FIG. 4 provides a simplified model for demonstrating the variation in the value of the capacitance between the ball and the copper tracks. In general, the capacitance between two plates is directly proportional to the area of the two plates, and inversely proportional to the distance between the two plates. Thus, in the ball/copper track capacitive system of the present invention, the capacitance at any given point between the ball and the copper track can be approximated by the ball surface area projected at that point ($A_i$), divided by the distance $d_i$ between the surface of the ball and the copper track. The total capacitance between a copper track and the ball can thus be approximated by the sum of $A_i/d_i$, where i covers the entire capacitive field between the two surfaces. Accordingly, as the ball 200 rolls to one end, the distance d for the capacitive field is at its minimum, which results in maximum value of capacitance between, the common terminal A (copper track 102) and the ball ($C_{a,ball}$), and for example terminal B (copper track 104) and the ball ($C_{b,ball}$), if the ball is in the right corner. The capacitance between terminals A and B ($C_{ab}$) is given by series connection of $C_{a,ball}$ and $C_{b,ball}$. Thus, when the ball is in the right position in FIG. 1, $C_{ab}$ is maximized and $C_{ac}$ is minimized.

The copper terminals directly connect to a capacitance detection circuit which detects the change in the capacitance between the terminals and signals the position of the ball.

Figure 5:
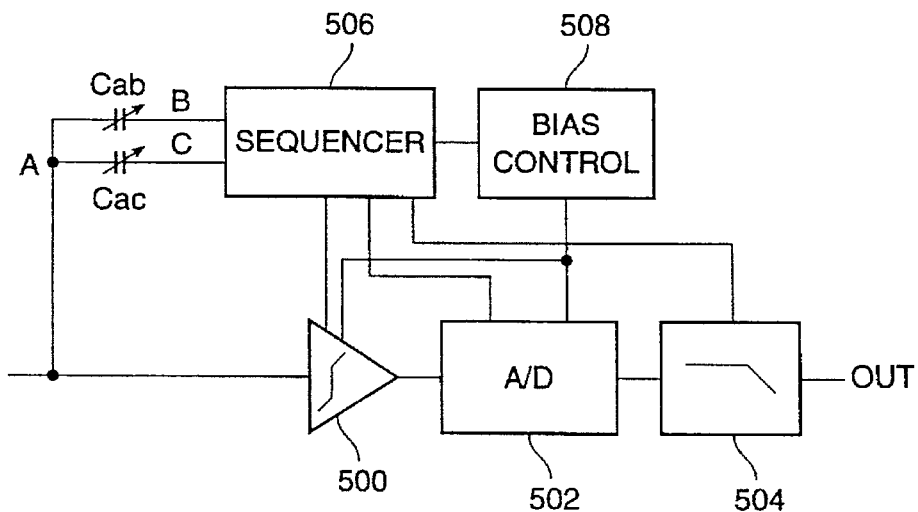
FIG. 5 is a block diagram of the capacitance detection circuit of the present invention.

FIG. 5 is a block diagram of a preferred capacitance detection circuit for the sensor of the present invention. The circuit includes an integrator 500 with an input connected to terminal A (copper track 102). The output of the integrator 500 connects to an analog to digital (A/D) converter 502 that converts the analog output of the integrator 500 to a multi-bit digital signal. The output of the A/D converter 502 is filtered by a digital low pass filter 504. A sequencer 506 provides all of the control signals for the various blocks of the circuit as well as the capacitor terminals B and C. A bias control block 508 provides the biasing for the various blocks of the circuit.

Figure 6:
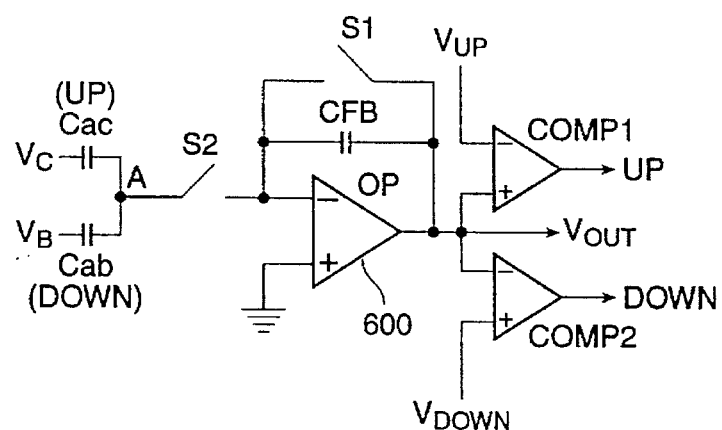
FIG. 6 is a simplified partial circuit schematic for the capacitance detection circuit.
Figure 7:
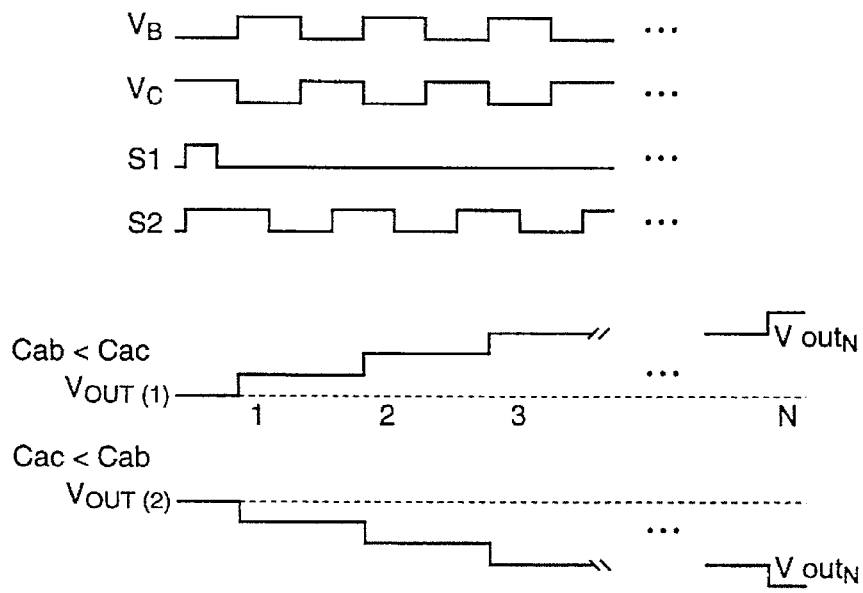
FIG. 7 is a timing diagram illustrating the operation of the capacitance detection circuit of the present invention.

The operation of the circuit is described in connection with FIGS. 6 and 7. FIG. 6 is a simplified schematic of the integrator 500 and the A/D converter 502, and FIG. 7 is a timing diagram that illustrates the operation of the circuit. The integrator 500 includes an operational amplifier 600 with a feedback capacitor $C_{FB}$ connecting the negative input of the amplifier 600 to its output $V_{OUT}$. A preset switch S1 connects in parallel with $C_{FB}$, and an integrating switch S2 connects the common terminal A to the input of the amplifier 600. The sequencer 506 controls the switches S1 and S2 and provides charge signals $V_B$ and $V_C$ to the other two capacitor terminals B and C. The output $V_{OUT}$ of the amplifier 600 is applied to the positive and the negative inputs of two comparators COMP1 and COMP2, respectively, inside the A/D converter 502. The negative input of COMP1 is connected to an upper threshold voltage $V_{UP}$, and the positive input of COMP2 is connected to a lower threshold voltage $V_{DOWN}$. The output of COMP1 indicates an up position and the output of COMP2 indicates a down position.

In operation, the sequencer 506 presets the integrator 500 by closing both switches S1 and S2. This causes all three capacitor $C_{FB}$ to be discharged and capacitors $C_{ab}$ and $C_{ac}$ to be precharged. After this preconditioning, the sequencer opens switch S1, and supplies a square wave $V_C$ to terminal C and its complement $V_B$ to terminal B. Switch S2 receives a square wave signal causing it to close at every falling edge of signal $V_C$. These signals are shown by the top four lines of FIG. 7. When switch S2 closes, any charge differential between capacitors $C_{ac}$ and $C_{ab}$ is integrated on capacitor $C_{FB}$. When capacitors $C_{ac}$ and $C_{ab}$ are equal, the complementary square wave signals $V_C$ and $V_B$ cause any charge dumped by one capacitor to be cancelled by the other. Thus, under equal capacitance conditions, there is no charge differential developed on terminal A. Once the ball rolls to one end of the hole, the capacitances change as described above and charge differential starts to develop at terminal A. This charge differential is incrementally integrated by switch S2 onto capacitor $C_{FB}$. The signal $V_{OUT}(1)$ in FIG. 7 shows the case where the value of $C_{ab}$ is smaller than that of $C_{ac}$, and signal $V_{OUT}(2)$ shows the opposite. This analog output signal is compared to the two threshold voltages $V_{UP}$ and $V_{DOWN}$ at the A/D converter 502. If $V_{OUT}$ is greater than $V_{UP}$ ($C_{ab}<C_{ac}$), then output of COMP1 is asserted signaling the location of the ball in the left position. If $V_{OUT}$ is less than $V_{DOWN}$ ($C_{ac}<C_{ab}$), then the output of COMP2 is asserted signaling the location of the ball in the right position.

By controlling the size of the feedback capacitor $C_{FB}$ and the frequency of the square wave signals applied to terminals C and B, the length of time after which a detect signal is asserted can be adjusted. The digital low pass filter 504 filters out high frequency changes to avoid detecting unintended movements caused by quick disturbances.

The capacitance detection circuitry is preferably implemented on a single chip integrated circuit and placed on the same printed circuit board (PCB) as the hole. This allows for a very compact design using conventional PCB technology and reduces all parasitic capacitances. Another advantage of the capacitive position sensor of the present invention is that while the ball should be conductive, it is not required to make ohmic contact with any terminals. The conductivity requirement for the ball is minimal and is only for the purposes of charge redistribution across its body. The surface of the ball therefore need not be conductive, which drastically reduces susceptibility to dust, moisture, oxidation and general environmental erosion. In fact, the ball can have a resistivity of as much as, for example, 5 Mohms without affecting the operation of the system. Thus, the ball need not be made of any special material, which allows the use of a regular, for example, steal ball used in conventional ball-bearings.

Figure 8A:
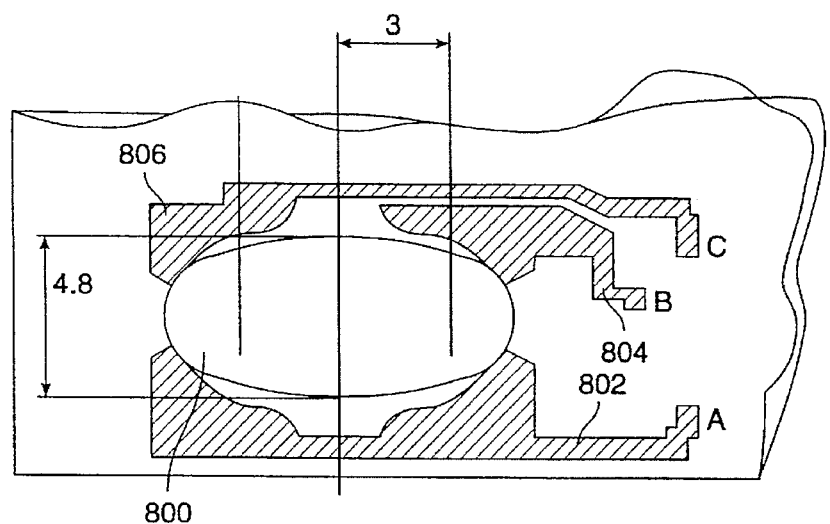
FIGS. 8A and 8B show a capacitive inclination sensor with a continuous read out according to another embodiment of the present invention.
Figure 8B:
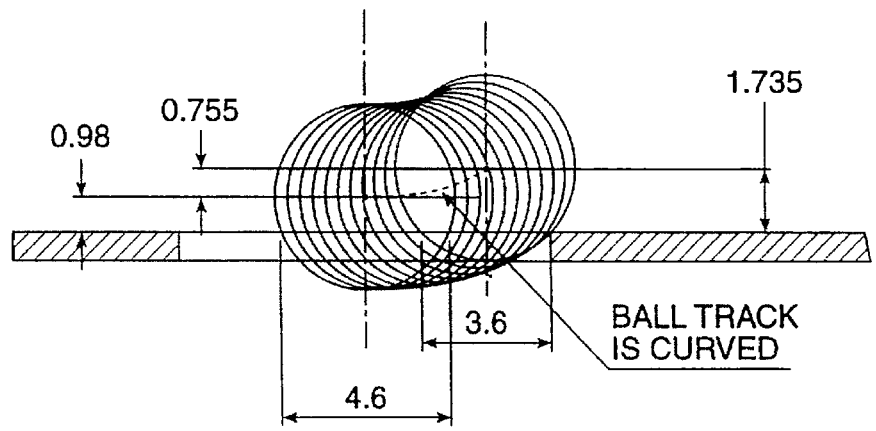

In the embodiment described above, the position sensor has only three stable positions and therefore can detect, for example an up or down position when the board tilts passed a certain angle. Using the same capacitive detection principles, it is possible to provide an analog or continuous readout of the position of the ball. In a continuous readout system, the sensor detects, for example, the angle of inclination for a range of postions of the PCB. The basic principles of operation are similar to the embodiment described above. The difference in the case of the continuous readout system is in the shape of the hole 100 and the layout of the copper tracks. FIG. 8A shows the relevant portion of the PCB according to this embodiment of the present invention. Here the hole 800 has an elliptical shape, and the copper tracks 802, 804, and 806 are shaped to maximize linearity between the printed circuit board angle and the $V_{OUT}$ signal. Due to the elliptical shape of the hole 800, the center of gravity of the ball does not move upwardly in a linear fashion as in the embodiment shown in FIG. 2. Instead, in the case of an elliptically-shaped hole 800, the ball's center of gravity moves along a curved line as shown in FIG. 8B. As a result, every position of the ball has a corresponding distance between the ball and the copper tracks, yielding specific capacitor values for $C_{a,ball}$, $C_{b,ball}$ and $C_{c,ball}$. Thus, the analog output $V_{OUT}$ of the integrator 500 becomes a function of the angle of the PCB. By calibrating this function using, for example, an external microprocessor, the apparatus of present invention according to this embodiment can perform direct angle measurements. In this case, the A/D converter 502 would require higher resolution of, for example, eight bits (for 256 positions).

Figure 9:
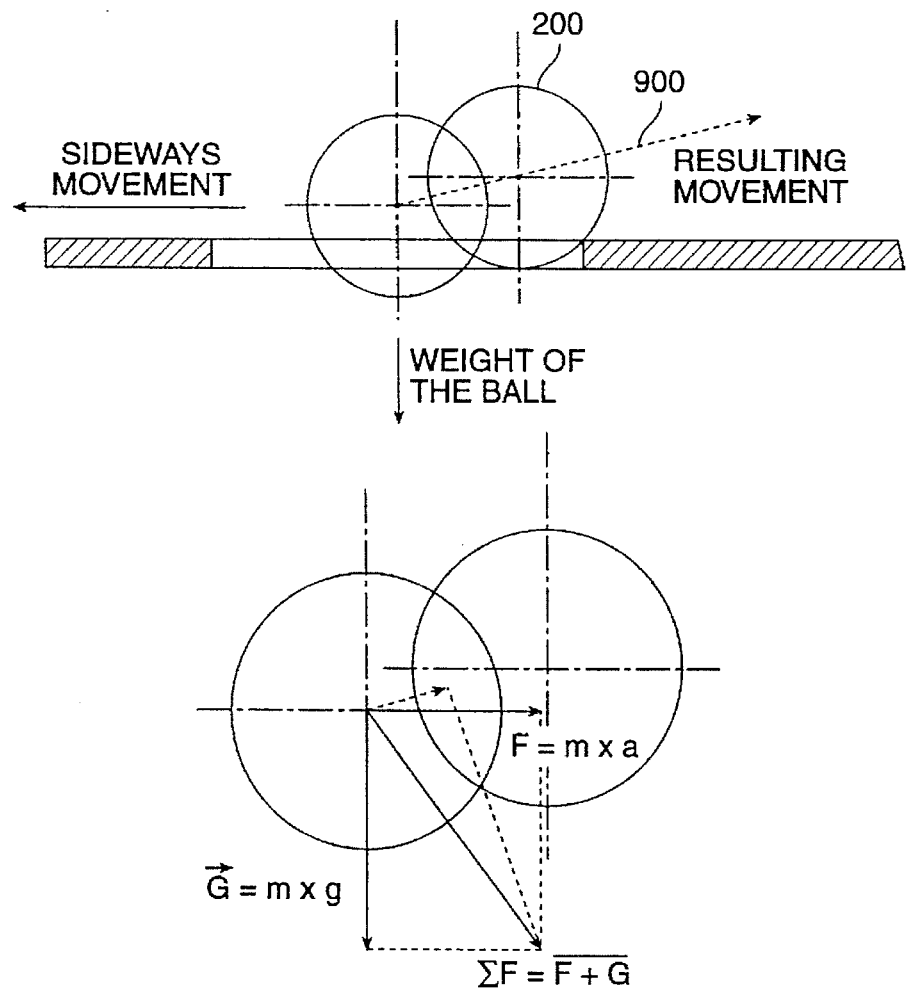
FIG. 9 illustrates the principles of operation for the capacitive acceleration sensor embodiment of the present invention.

In another embodiment, the basic principles of the capacitive position sensor of the present invention are applied to detect acceleration. FIG. 9 illustrates the principles of operation for the capacitive sensor of the present invention when used as an acceleration sensor. Assuming a hole shaped as shown in FIG. 1, the dotted line 900 in FIG. 9 represents the line on which the center of gravity of the ball moves when it rolls in the hole. There are two forces acting on the ball's center of gravity: a force F (=m*a) due to acceleration (a) of the board in a direction opposite to that of the direction of F, and a force G (=m*g) due to gravity. The total force ΣF acting on the ball is the sum of these two forces. The ball will start to move when the projection of the ΣF line onto the dotted line 900 points to either the left or the right of the vertical line. For example, for a PCB as shown in FIG. 1, the value of this critical acceleration is given by the equation g*tg(α), where g is gravity and α is the predefined threshold angle. Thus, with the exemplary threshold angle of 12.9 degrees, the acceleration at which the ball starts to move is equal to 9.81*tg(12.9)=2.26m/s². That is, if the PCB experiences acceleration in one direction greater than 2.26m/s², the ball will move in the opposite direction. In another example, if the PCB is fixed at a 45 degree inclination, when the acceleration component is greater than gravity (i.e., a>g), the ball will start to move. It is to be understood that in the example where the board is fixed at a 45 degree angle, the shape of the hole as well as the layout of the copper tracks would be different than that shown in FIG. 1. The principles of operation in terms of detection of variations in capacitor values is essentially the same as the first embodiment described.

Figure 10:
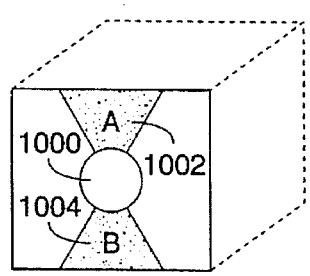
FIG. 10 shows one plate of a cube for a three-dimensional position sensor according to another embodiment of the present invention.

In yet another embodiment, the PCB-based capacitive position detection system of the present invention can be used as a three-dimensional (3D) position sensor. In the 3D position sensor embodiment, a cube is made out of six PCBs. FIG. 10 shows an example of one side of such a cube. A circular recessed region 1000 is provided in a central location of the PCB. Two electrically conductive tracks 1002 and 1004, corresponding to capacitor terminals A and B, are laid on either sides of the recessed region 1000. Without a ball inside the cube, all six capacitors $C_{(ab)i}$, where i represents each side, would be equal in value. If a ball is positioned in the recessed region 1000 of side k, then the value of $C_{(ab)k}$ would be greater than that of $C_{(ab)j}$, where j represents the remaining five sides. This difference in capacitor values can be detected by a capacitance detection circuit in a fashion similar to the first embodiment described above. In this embodiment, however, because there are six variable capacitors, the capacitance detection circuit must provide for multiplexing between the six sides. That is, while one of the terminals per side, for example A, commonly connects to all of the other terminals A on each side, the other terminals $B_i$ separately control signals. A selected terminal $B_k$ on a side receives a square wave $V_B$, while the other five B terminals receive the complement of $V_B$. This is repeated six times, once per side. The capacitance detection circuitry would then be able to determine which side of the cube carries the ball at any given time.

In conclusion, the present invention provides a capacitive position sensor that can be implemented using conventional PCB technology. Because the position sensor operates based on detection of change in capacitance caused by a moving ball, the apparatus is substantially less susceptible to environmental erosion. There are a number of application for the capacitive position detection apparatus of the present invention. The inclination sensor embodiment, for example, can be used in an iron to shut off the heating element when the iron remains unmoved (acceleration sensing) in a horizontal position (inclination sensing) for a predetermined period of time. In another application, the sensor of the present invention can be used as a car alarm.

While the above is a complete description of the various embodiments of the present invention, it is possible to use various alternatives, modifications and equivalents. For example, the capacitive sensor of FIG. 1 is also sensitive to a human's finger. Without using a ball, by bringing ones finger close to one end of the hole, one would modify the capacitance for $C_{ab}$ and $C_{ac}$. This embodiment could be used as a double contactless switch. Such a switch would be highly reliable as it would be insensitive to dust and oxidation. Therefore, the scope of the present invention should be determined not with reference to the above description but should, instead, be determined with reference to the appended claims along with their full scope of equivalents.

What is claimed is:

1. A position sensor comprising:

a printed circuit board (PCB) having an elongated aperture stamped therethrough, a first terminal of electrically conductive track disposed on a surface of said PCB along a first side of said elongated aperture, and a second terminal of electrically conductive track disposed on said surface of said PCB along a second side of said elongated aperture;

a ball rollably disposed in said elongated aperture; and a capacitance detection circuit coupled to said first and second terminals for detecting a change in the capacitance between said first and second terminals, as said ball rolls along said elongated aperture.

2. The position sensor of claim 1 wherein said printed circuit board further comprises a third terminal of electrically conductive track disposed on said surface of said PCB along said second side of said elongated aperture.

3. The position sensor of claim 2 wherein said capacitance detection circuit comprises:

an integrator having an input coupled to said first terminal, and an output;

an analog to digital converter having an input coupled to said output of said integrator; and a sequencer coupled to said second and third terminals, said integrator and said analog to digital converter, wherein, said integrator and sequencer measure a difference between capacitances between said first and second electrically conductive tracks and said first and third electrically conductive tracks.

4. The position sensor of claim 3 wherein said capacitance detection circuit further comprises:

a low pass filter having an input coupled to an output of said analog to digital converter, and an output coupled to an application device; and a biasing circuit coupled to said integrator, said analog to digital converter and said sequencer.

5. The position sensor of claim 1 wherein said elongated aperture is shaped such that said ball rests in a central portion of said elongated recessed region when said printed circuit board is undisturbed, and rolls in one of two directions along a single longitudinal axis of said elongated aperture when said printed circuit board is disturbed.

6. The position sensor of claim 1 wherein said elongated aperture is elliptically-shaped such that said ball rolls continuously along a longitudinal axis from one end to the other of said elongated aperture as said printed circuit board experiences inclination or acceleration.

7. The position sensor of claim 4 wherein said integrator comprises:

an operational amplifier having a first and a second input and an output;

a first switch coupled between said first terminal and said first input of said operational amplifier;

a second switch coupled between said first input of said operational amplifier and said output of said operational amplifier; and a capacitor coupled between said first input of said operational amplifier and said output of said operational amplifier, wherein, said first and second switch are controlled by said sequencer.

8. A position sensor comprising:

a printed circuit board having an elongated aperture stamped therethrough, said printed circuit board further comprising:

a first terminal of an electrically conductive track disposed at an edge on a first side of said elongated aperture, a second terminal of an electrically conductive track disposed at an edge on a second side of said elongated aperture, and a third terminal of art electrically conductive track disposed at an edge on said second side of said elongated aperture;

a ball rollably disposed in, and supported by edges of said elongated aperture; and a capacitance detection circuit coupled to said first, second and third terminals for measuring a change in the capacitance between said first and second terminals and said first and third terminals, as said ball rolls along the edges of said walls of said elongated recessed region, said capacitance detection circuit comprising:

an integrator coupled to said first terminal;

an analog to digital converter coupled to an output of said integrator; and a sequencer coupled to said second and third terminals and said integrator and said analog to digital converter.

9. The position sensor of claim 8 wherein said elongated aperture is shaped such that the width of said elongated aperture is at its maximum at a middle section and tapers off as it approaches either ends along its longitudinal axis, and wherein, said capacitance detection circuit further comprises a low pass filter coupled to an output of said analog to digital converter.

10. A method for sensing the position of an object comprising the steps of:

(a) providing the object with a printed circuit board;

(b) stamping an elongated aperture through said printed circuit board;

(c) disposing first and second electrically conductive tracks on either sides of said elongated aperture, respectively;

(d) placing an electrically conductive ball on said elongated aperture such that said ball rolls along a longitudinal axis of said aperture supported by sidewalls of said aperture; and (e) detecting variations in capacitance between said first and second electrically conductive tracks as said ball rolls along said elongated aperture.

11. The method of claim 10 wherein said step of detecting further comprises the steps of:

(f) providing a capacitance detection circuit on said printed circuit board that detects a difference between capacitance values; and (g) coupling said capacitance detection circuit to said first and second electrically conductive tracks.

12. The method of claim 11 wherein said step of disposing further comprises disposing a third electrically conductive track on the same side but the opposite end of said elongated recessed region as said second electrically conductive track.

13. The method of claim 10 wherein said step of detecting further comprises the steps of:

(h) integrating said variations in capacitance to generate an analog signal; and (i) converting said analog signal into a digital signal representative of a position of said ball.

14. The method of claim 13 wherein said step of detecting further comprises the step of filtering high frequency components of said digital signal.

* * * * *